United States Patent [19]

Weimer

[11] 4,200,892
[45] Apr. 29, 1980

[54] SOLID STATE IMAGE SENSOR

[75] Inventor: Paul K. Weimer, Princeton, N.J.

[73] Assignee: RCA Corporation, New York, N.Y.

[21] Appl. No.: 890,193

[22] Filed: Mar. 27, 1978

[51] Int. Cl.$^2$ .................. H04N 3/14; H04N 9/07; H01L 27/14
[52] U.S. Cl. .................. 358/213; 358/44; 357/30
[58] Field of Search .......... 357/30; 358/213, 44, 358/48; 250/211 J, 578; 365/114

[56] References Cited

U.S. PATENT DOCUMENTS

| | | | |
|---|---|---|---|
| 3,715,485 | 2/1973 | Weimer | 358/213 |
| 3,763,480 | 10/1973 | Weimer | 340/173 R |
| 4,011,442 | 3/1977 | Engeler | 358/213 |
| 4,012,587 | 3/1977 | Ochi et al. | 358/213 |
| 4,032,947 | 6/1977 | Kesel et al. | 357/24 |
| 4,040,076 | 8/1977 | Kosonocky et al. | 357/30 |
| 4,054,906 | 10/1977 | Yamanaka | 358/44 |

OTHER PUBLICATIONS

Tasch et al., "The Charge-Coupled RAM cell Concept", *IEEE Journal of Solid State Circuits*, vol. sc-11, No. 1, Feb. 1976, pp. 58-63.

Sequin et al., *Charge Transfer Devices*, Academic Press, 1975, pp. 42-44.

*Primary Examiner*—John C. Martin
*Attorney, Agent, or Firm*—H. Christoffersen; H. I. Schanzer

[57] ABSTRACT

Photo sensitive elements formed on a surface of a substrate are arranged in rows and columns. Column conductors for selectively collecting the information contained in the photo elements are diffused along the length of each column in the same surface of the substrate as the photo elements. A barrier region is formed between the photo elements of each column and their associated column conductor for, normally, preventing leakage of charge from the diffused column conductors back into the photo elements. Row conductors, insulated from the surface of the substrate, are disposed transversely to the columns and lie over the rows of photo elements. Driving voltages applied to a row conductor either place the photo elements of that row in a signal collecting mode or else enable the collected signals in the elements of that row to surmount the barrier and flow into their corresponding column conductors.

4 Claims, 10 Drawing Figures

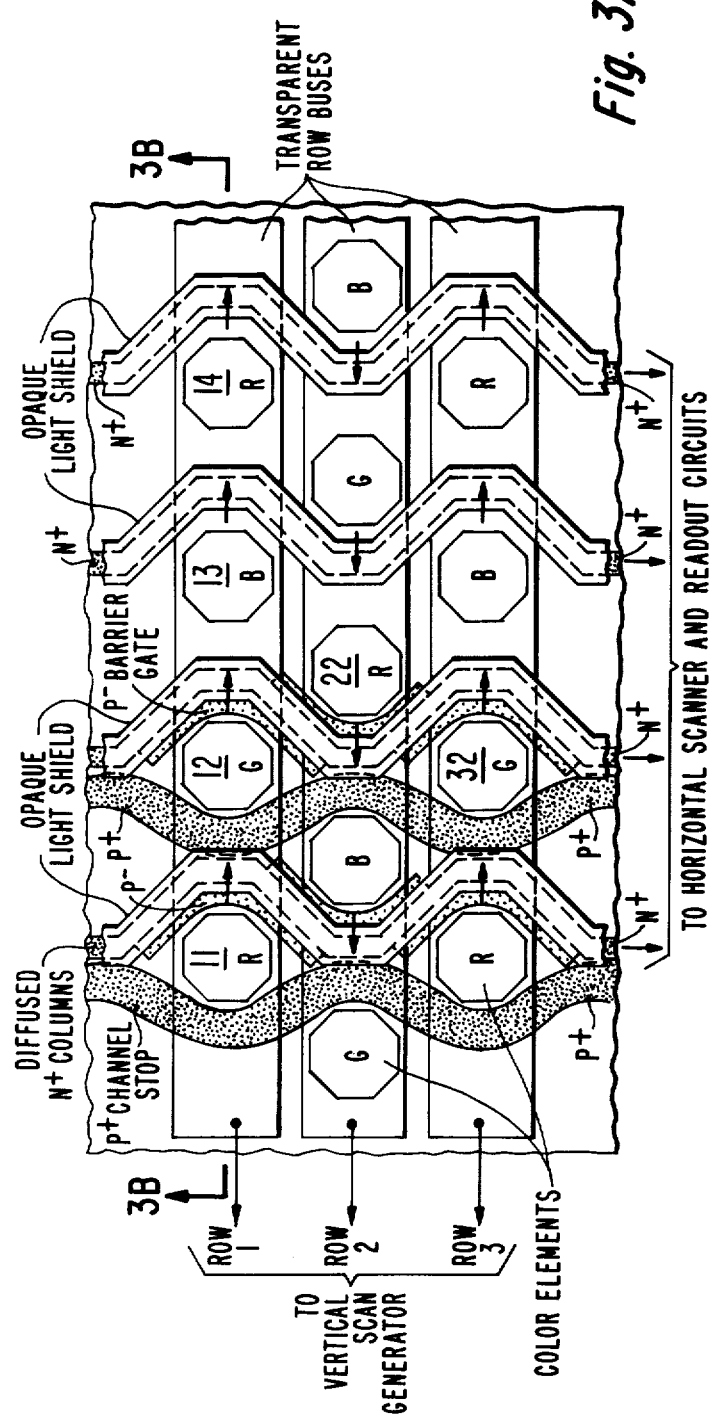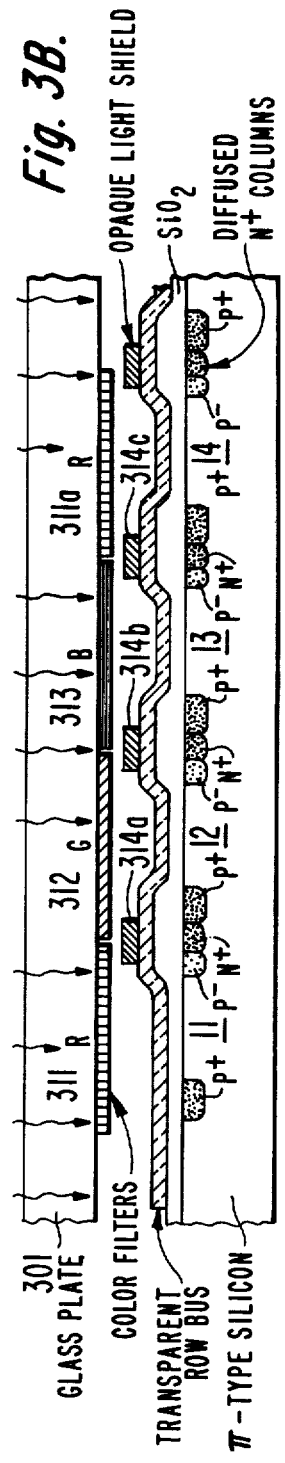

SOLID STATE IMAGE SENSOR

This invention relates to solid state image sensors and, in particular, to XY image sensors (hereafter referred to as "XY imagers").

An XY imager normally includes a matrix array of photo elements arranged in rows and columns with a row (X) conductor per row and a column (Y) conductor, per column, disposed transversely to the row conductors. Typically, a photo element and some type of switch are located at each intersection of a row and a column conductor. In response to one type of signal applied to a row conductor, the switches along the row are turned off and the photo elements of the row are isolated from the column conductor and can collect charge generated by photo signals. In response to another type of signal applied to the row conductor the switches along the row are turned on and the charge information collected at each photo element of that row is transferred to its corresponding column conductor. The signals applied to the column conductors are then sequentially transferred to a single video output terminal.

In circuits embodying the invention, there is no need for a separate switch to isolate or couple a photoelement to a column conductor.

XY imagers have important advantages over solid state image sensors comprised of photosensitive charge transfer (e.g. CCD, bucket brigade) shift registers (hereafter referred to as "register imagers") arranged in arrays of columns (or rows). XY sensors have a simpler structure than register imagers and can be produced at lower cost. The photo sensitive area of the XY sensor need not be covered by an array of charge transfer registers whose complex gate structure attenuates the light incident on the array. Furthermore, the XY sensor does not require a separate storage area which, in some presently commercially available register imagers, occupies as much space as the sensor itself.

Also, a problem associated with register imagers is that the signals undergo many transfers, requiring the transfers efficiency to be high to avoid loss of resolution. Furthermore, the number of transfers vary depending on the position of the element along a row or column. Thus, signals generated by some elements (i.e. the most remote from the sensor output) undergo more transfers than others and are, therefore, attenuated by different amounts. Still further, leakage and light incident on the array during read-out affects and alters the signals being read out.

Imagers embodying the invention includes a matrix array of photo sensitive elements formed in one surface of a substrate with one row conductor per row of elements and one column conductor per column of elements. The column conductors are diffused in the same surface of the substrate as the photo elements and are normally isolated from their columnar elements by means of a barrier gate. The row conductors are insulated from the surface of the substrate in which the elements and the conductors are formed. Each row conductor overlies the elements of a row, and is disposed transversely to the column conductors. Driving voltages applied to a row conductor are capacitively coupled to the photo elements of that row and place the row elements in either a signal accumulation mode or in a mode in which the accumulated signal can rise above the barrier gate potential and flow into their corresponding column conductors. The drive voltage applied to a row selects that row of elements to be read out and, simultaneously, causes the charge signals stored in the elements of that row to be transferred onto their corresponding column conductors without the need for placing an intermediate switch which has to be turned on and off between the photo elements and their column conductors. Thus, sensors embodying the invention have a relatively simple structure, and, as discussed below, are highly adapted to the fabrication of solid state XY imagers which can sense color.

In the accompanying drawings,

FIG. 3A is a top view of a portion of a barrier-gate color sensor embodying the invention; and FIG. 3B is a cross-section of one row of the array of FIG. 3A.

Figure 1A:
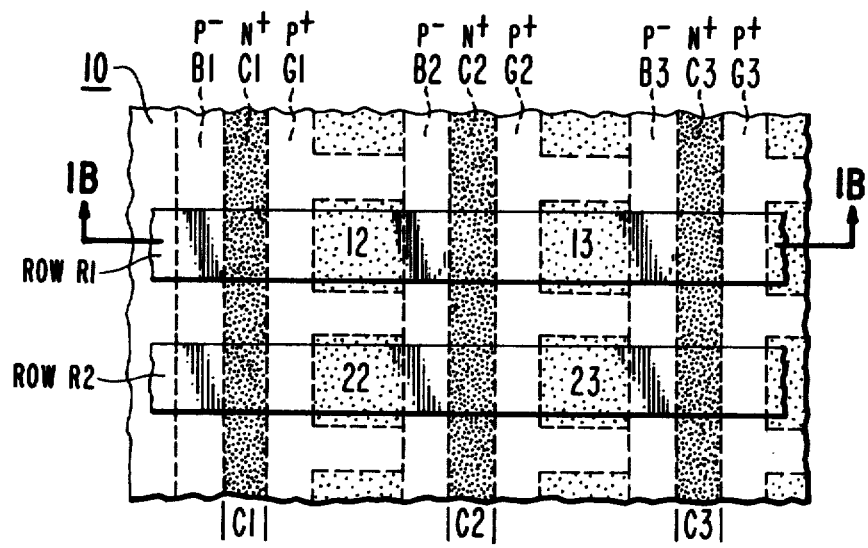
FIG. 1A is a top view of a portion of a barrier-gate capacitive array embodying this invention.

FIG. 1A shows the layout of a portion of a matrix array 10 of photo sensitive elements comprising "X" rows and "Y" columns; where X and Y are integers greater than one (1). The photo elements of the array are identified by a two digit (ij) number; the first digit (i) represents the order of the row and the second digit (j) represents the order of the column. Each photo element (ij) of a column is isolated from its corresponding column conductor (Cj) by a "discharge" or "transfer" barrier gate (Bj) of lightly doped P conductivity type (labelled P−) region formed between one side of the photo elements of a column and their corresponding column conductor. The barrier-gate Bj, normally, prevents charge collected in the column conductors from flowing back into the photo elements. The other three sides of the photo elements of a column are surrounded by an isolation guard-band (Gj−1) of heavily doped P conductivity type region, labelled P+, which prevents flow of charge from the photo elements of a column to any row or column other than its corresponding column conductor.

The photo elements are addressed and read-out by row (Ri) and column (Cj) conductors. Two of the row conductors, denoted R1 and R2, are shown extending the width of the array. The row conductors are insulated from the substrate. They function as gating electrodes whose applied potentials either isolate the elements from the column conductors and place the photo elements in a photo signal collecting mode or else cause the collected charge signals to be transferred to the column conductors. In this design, the row conductors cover most of the photo sensitive area. Hence, for maximum sensitivity they should be transparent (e.g. made of thin metal, tin oxide, indium, or polycrystalline silicon). The fabrication of transparent row electrodes is a relatively simple process for this type of XY array because the row conductors do not overlap each other and do not need to be as narrow as required for a CCD sensor of equal resolution. Three of the diffused Y column conductors, denoted C1, C2 and C3 are shown extending the length of the array at right angles to the rows.

Figure 1B:
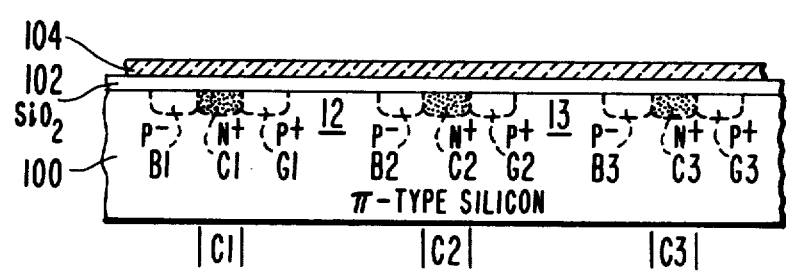
FIG. 1B is a cross-section of one row of the array of FIG. 1A.

The construction of the row and column conductors and the photo elements may be better understood with reference to FIG. 1B which shows a cross section of a portion of row R1. The matrix array is formed on, and within, a lightly doped silicon substrate 100 of P conductivity type. The symbol $\pi$ is used to indicate the conductivity type of the substrate to prevent confusion with the more heavily doped P− and P+ regions of the barrier-gate and guard-band, respectively. The column conductors (Cj) are formed by diffusing relatively heavily doped regions of N conductivity type, labelled N+, (opposite conductivity to the substrate) into the top surface of the substrate. The barrier-gate (B1, B2, B3) formed to one side of each column conductor provides a selectively enabled unidirectional conduction path between the photo elements of a column and their corresponding column conductor. To the other side of each column conductor is the isolation guard-band region (G1, G2, G3) of P+ conductivity type. The P+ designation indicates that the guard-band region is more heavily doped than the P− barrier-gate region which in turn is more heavily doped than the substrate 100. Typical doping levels for the substrate, the barrier-gate, and the guard-band might be, respectively, $5 \times 10^{14}$ acceptors/cc, $10^{16} - 10^{17}$ acceptors/cc, and $10^{19}$ acceptors/cc. The space between the P+ region of one column and the P− region of the next higher order column defines the photo sensitive region.

An insulator layer 102 formed of silicon dioxide ($S_iO_2$) is disposed over the top surface of the substrate, and the row conductors (buses) 104, are formed on top of the insulator layer.

Figure 1C:
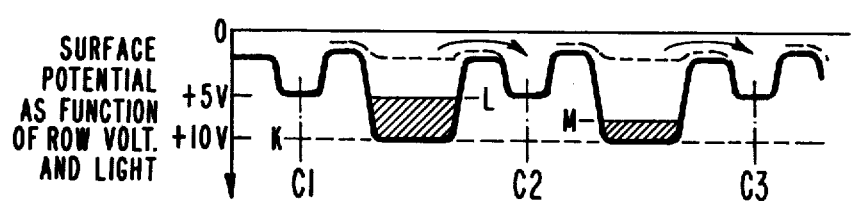
FIG. 1C is a waveform diagram of typical surface potentials produced along a row as a function of voltages applied to, and light incident on, the row.

In response to a positive voltage applied to a row conductor a potential well is formed in the photo element regions (ij) along the row. The surface potential diagram of FIG. 1C is designed to indicate that corresponding to a drive voltage of, for example, +10 volts applied to the row conductor, a potential well of depth equal to the level marked "K" is formed at each photo element. The barrier height surrounding the photo elements will be higher in the P+ guard-band region than it is in the more lightly doped P− barrier-gate region. Light (or other energy source) incident on a photo element causes the excitation of electron-hole pairs and the electrons become stored in the potential well (i.e. the substrate potential becomes less positive) as illustrated by levels marked "L" and "M". The number of electrons which become stored in a well is proportional to the light or radiation intensity incident on the photo element represented by that well. When the row drive voltage goes to 0 volts (to discharge the element following a positive-going excursion) the well potential also goes towards zero and the electron charge collected in the potential well region of the photo element flows over the transfer or discharge barrier (Bj which is lower in potential than the guard-band Gj) into the diffused column conductor region associated with the photo element. If no charge had been collected in the potential well, the well is raised to the "O" level and no signal charge is transferred to the column conductor.

The properties of the matrix array of FIG. 1A and 1B may be more easily explained by reference to the schematic diagram of FIG. 1D which uses conventional discrete component symbols to represent the structure shown in FIGS. 1A and 1B.

As indicated for element 12, each photo element in a photo signal accumulation mode may be represented by a capacitor (S1) connected at one plate to a row conductor (e.g. R1) and at its other plate to a node, N1, to which the cathodes of two diodes, D1 and D2 are connected. A third diode D3 is connected between the anode (barrier-gate region) of diode D2 and the column conductor.

The equivalent circuit is derived from the following considerations. With zero volts applied to a row conductor each photo element site along the row may be represented as a capacitor ($C_{OX}$) with the row conductor and the substrate forming the two plates of the capacitor and the silicon dioxide layer being the insulator between the plates. (Hence, the array 10 is termed a "capacitive" array.) When a positive potential is applied to a row conductor, the surface of the substrate at the photo element sites is depleted of holes forming a potential well at each element. When photo electrons collect in this well the surface is inverted and becomes N-type. The potential well region then functions as one plate of $C_{OX}$, the other plate of $C_{OX}$ being, still, the row conductor. The junction between each potential well and the substrate defines a PN junction which is represented as a photo sensitive diode D1 and which has a junction capacitance ($C_d$). Since $C_d$ is much smaller than $C_{OX}$, the latter essentially defines the capacitance of the photo element during the charge accumulation period and is represented as S1. The PN junction formed between the depletion well and its corresponding barrier gate region is represented by diode D2 and the PN junction formed between the barrier gate region and the N+ diffused column bus is represented by diode D3. Diodes D2 and D3 act as the emitter and collector diodes of a lateral—flow NPN transistor during each discharge of the photo element into the column bus.

Figure 1D:
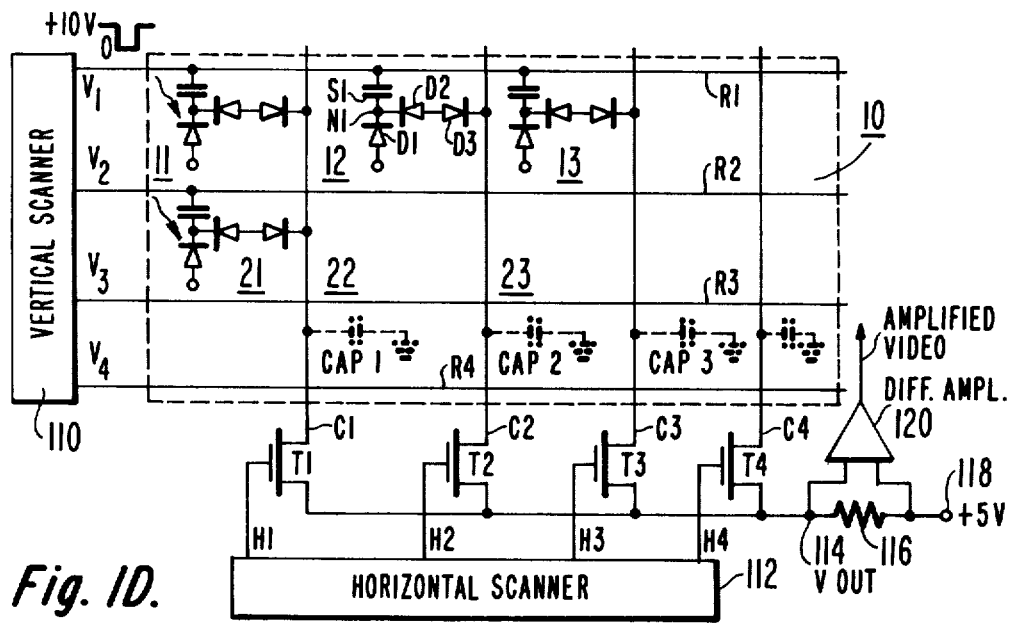
FIG. 1D is a schematic diagram showing the equivalent circuit of the structure of FIGS. 1A and 1B.

The matrix array in FIG. 1D is scanned by means of a vertical scan generator 110 and a horizontal scan generator 112. The outputs of the horizontal scanner 112 are connected to the gates of switching transistors (T1, T2, T3, T4) whose conduction paths are connected between their respective column conductors and an output point 114. A load resistor 116 is connected between output terminal 114 and terminal 118 to which is applied an operating potential, which for purpose of illustration is set at +5 volts. A differential amplifier 120 has its two inputs connected between terminals 114 and 118 and produces at its output an amplified version of the signal present at terminal 114.

To more easily understand the operation of the system, the operation of a single photo element (e.g. 12) is detailed. Assume that the photo element has just been read out and that its internal node N1 is initially at a quiescent voltage of approximately zero volts. A positive reset voltage step of amplitude $V_A$ applied to a row conductor (e.g. R1) is capacitively coupled to the internal node N1 of the element. The potential at node N1 then rises by $V_A$ volts at the beginning of a charge integration period. Referring back to FIG. 1C a potential well of depth "K" is formed when $V_A$ is equal to +10 volts.

Light incident on the photo element causes photo diode D1 to discharge node N1 towards the substrate potential (e.g. ground). The period during which incident light is allowed to discharge the photo element is defined as the integration time or "frame" period and, in TV applications, is normally 1/30 of a second. When the positive voltage step applied to the row conductor terminates (e.g. goes from $V_A$ to zero), the capacitive coupling from the row to the node N1 causes it to go negative by an amount approximately equal to $V_A$. Emitter diode D2 is, then, momentarily forward-biased causing an electron current to flow through the D2-D3 transistor to the column conductor in proportion to the amount by which the node N1 had been discharged by the light. The charge signal which had been developed at node N1 is thus redistributed between the elemental capacitor S1 and the column conductor capacitance (e.g. CAP 2) shown in dashed line. Since the column conductor capacitance is much greater than S1 substantially all of the photo electron charge is transferred from the elemental capacitance to its corresponding column conductor. Due to the relatively large column capacitance, the column voltage is lowered by an amount $\Delta V_C$ which is small compared to the photo element signal voltage. The signal $\Delta V_C$ transferred to the column conductor is then sensed by recharging the column conductor capacitance and by measuring the current, voltage, or charge needed to restore it to its original condition.

Figure 1E:
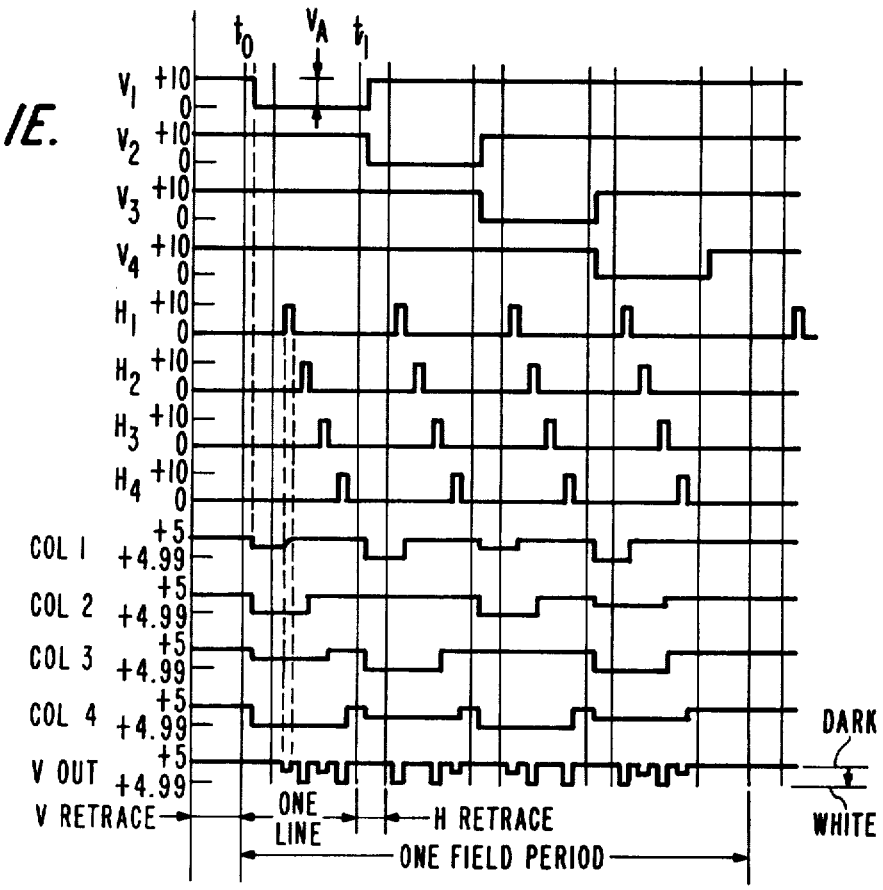
FIG. 1E is a waveform diagram of typical scanning signals used to operate the array of FIG. 1A.

The operation of the matrix array of FIGS. 1A and 1B (as represented in FIG. 1D) is now explained with reference to the waveform diagrams of FIG. 1E. Assume by way of example, that at time $t_0$ the driving potential $V_1$ applied to row R1 by scanner 110 makes a negative going transition from +10 volts to 0 volts. This terminates the "integration" cycle of the elements along row R1 and causes the charge accumulated at the internal node N1 of each photo element along selected row R1 to be transferred or redistributed onto the capacitance of its associated column conductor.

The horizontal scan pulses (H1, H2, H3, H4) cause the switching transistors (T1, T2, T3, T4) to be sequentially turned on. When a switching transistor is turned on a current flows from terminal 118 through resistor 116 and via the conduction path of the turned on switching transistor onto its associated column conductor. This current recharges the column conductor capacitance and the photo element node N1 to their initial values. Since the amplitude of the recharging current is proportional to the accumulated charge signal a video output is produced at terminal 114 which is also proportional to the photo signal. After all the column conductors are recharged, the elements along another row (e.g. R2) are read out and recharged. This process is repeated until all the rows of the array have been read out.

It should be appreciated that diodes D2-D3 are merely symbolic representations of the blocking action of the barrier gate during the charge accumulation mode and have been used only to ease the explanation of an operating mode of the array.

It has been shown that during the charge collection ("integration", or "accumulation") period a photo element, is isolated from any other element or column conductor by means of the guard band and barrier gate surrounding the element. It is only when the overlying row conductor is pulsed that the element's stored charge rises above the potential barrier of the barrier-gate and is transferred to a column conductor without the need for an intervening switch in the signal path.

Figure 2A:
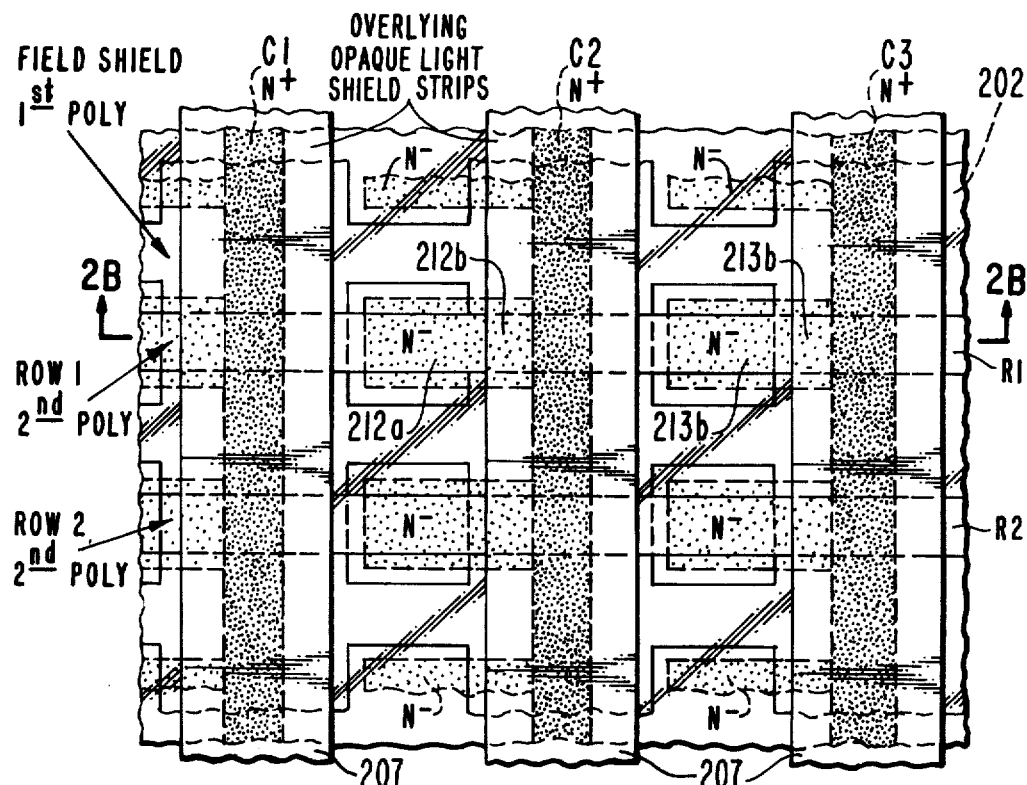
FIG. 2A is a top view of a portion of a barrier-gate photo diode array embodying the invention.
Figure 2B:
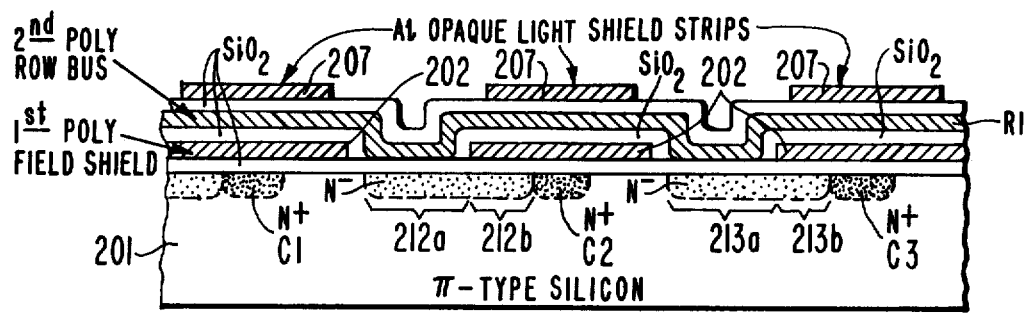
FIG. 2B is a cross section of one row of the array of FIG. 2A.

The structure of FIGS. 1A and 1B may be modified as shown in FIGS. 2A and 2B.

Figure 2C:
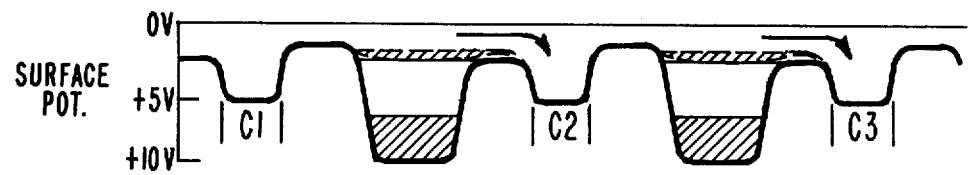
FIG. 2C is a waveform diagram showing surface potentials along the cross-section of FIG. 2B.

In the array of FIGS. 2A and 2B an apertured field shield electrode 202 covers the entire top surface of a lightly doped substrate 201 of P conductivity type except for the area dedicated to the photo elements. The field shield 202, is biased at a negative voltage relative to the potential (ground) applied to the substrate 201, and replaces the P+ guard band region of FIGS. 1A and 1B. A region (212, 213) of lightly doped N conductivity type, labelled N−, is formed or diffused adjacent to each column conductor (Cj) region of N+ conductivity type in the top surface of the substrates 201. One part (212a, 213a) of each N− region isolated from, and directly underneath, a row conductor defines the photo element site. Another part (212b, 213b) of each N− region, formed directly under the field shield electrode 202, in combination with the field shield, defines a barrier-gate between the photo element on one side and the column conductor on the other. This field shield 202 forms a high potential barrier which surrounds each photo element except on the photo element side contiguous to the barrier gate (212b, 213b) region. The potential of the barrier gate, due to the combination of the negatively biased field shield electrode 202 and the N− region (212b, 213b) underneath it, is lower than the potential in the guard band region, as shown in FIG. 2C. This permits transfer of charge signal between each photo element and its corresponding column conductor while the flow of charge signal to any other row of elements or other column conductor is blocked.

The N− region at the photo element site increases the conductivity of each photo element when its row conductor is positively biased. This permits the row conductors to be made narrower than in FIG. 2 (and even opaque) enabling a large portion of the useful light to impinge on the photo element along the sides of the row conductors. The type of array shown in FIGS. 2A and 2B is termed a photo diode array since the junction of each N− region and the P type substrate forms a photo sensitive diode. The photo sensor area 212a, 213a could be more heavily doped to form an N+ island which would be selectively coupled to the N+ column by means of the barrier gate formed by the combination of the N− region 212b, 213b under the negatively biased field shield.

The field shield layer 202 may be a conducting polycrystalline silicon layer or any suitable metal layer over which the row buses can be deposited. A practical structure would use a first polycrystalline silicon for the field shield and a second polycrystalline silicon for the row conductors. A light shield 207 is formed over the column conductors to prevent the generation of photo electrons in the immediate vicinity of the diffused column conductors. The light shield comprises a layer of opaque aluminum deposited over the column conductor regions which is isolated from the second poly row conductors by an oxide layer. The opaque aluminum could be deposited in strips over the column conductors or it could be deposited in a continuous sheet with apertures for admitting light to the sensor elements.

Although different techniques are used for forming the barrier in FIG. 2, the resulting surface potentially profile in the semiconductor is substantially the same as in FIG. 1 and the operating mode of the array is essentially the same as described for FIG. 1 and is not repeated.

the image sensor of FIGS. 1A and 1B may be modified as shown in FIGS. 3A and 3B to form a three-color (for example red, green, blue) sensor for use in a color camera.

FIG. 3B shows the cross section of a typical row of the array with color filters overlying the array. A glass plate 301 on the underside of which are mounted color filters (311, 312, 313) for different ones of the primary colors (blue, green, red) is placed on top of the array. Opaque light shields (314a, 314b, 314c) which may be of aluminum are deposited on top of transparent row conductors which may be of tin oxide. The light shields isolated from the row conductors by an insulator such as deposited aluminum oxide, cover the column conductor regions to prevent incident light from affecting the signals collected on the column conductors.

The remainder of the cross sectional diagram is the same as the structure of FIG. 1B. Light from a scene reaches the sensor elements after passing through the overlying glass plate containing the elemental color filters arranged in the pattern shown, by way of example. Referring to the plan view of FIG. 3A, the photo elements of the array are designated, R, G, and B corresponding to the respective red, green or blue color filter overlying them. To produce a higher resolution color picture for a given number of elements, the photo elements of a column are staggered, as shown, rather than being lined up with each column containing elements of the same color. Thus, each column includes photo elements positioned on either side of the column conductor.

In the layout of FIG. 3A the photo elements of the odd numbered rows are positioned to the left of their corresponding column conductor and the photo elements of the even numbered rows are to the right of their corresponding column conductor. Each photo element is surrounded on three sides by a P+ guard band region and on the one side between it and its column conductor by a P— barrier-gate, just as in FIG. 1, such that the photo information collected at each photo element only flows to its designated column conductor as indicated by the arrows.

The color sensor of FIGS. 3A and 3B can be scanned by means of digital shift registers (not shown) with the outputs of the column conductors multiplexed as illustrated in FIG. 1D. However, the read-out circuitry (not shown) must provide for correctly sorting the staggered color information appearing on the column conductors.

The significance of the structure of FIGS. 3A and 3B is that it demonstrates that the barrier-gate diffused column conductor sensor described in this application is particularly suitable for a staggered pattern color sensor because the narrow diffused column conductors can be easily angled or made to wind around the photo elements. Known CCD structures with staggered elements are much more complex and have relatively less space available for the photo elements.

It is obvious that the barrier gate sensor of FIGS. 2A and 2B could also be modified to form a color sensor.

It should be appreciated that all the photo elements of a row are read-out simultaneously onto their column conductors. The read-out from the column conductors to the video output point then extends for a full line time while the signal charges are temporarily stored in the columns for different lengths of time.

The uniformity and sensitivity of the XY sensor of FIGS. 1 and 2 might be improved by replacing the output multiplexer (transistors T1, T2, T3, T4) in the columns with a charge transfer register of the type shown in FIG. 3 of U.S. Pat. No. 3,715,485 or FIGS. 1 and 6 of U.S. Pat. No. 3,763,480. These read-out schemes are known and need not be detailed. Suffice it to say that the XY sensor arrays of the invention can be scanned by charge-transfer techniques thereby retaining the benefits of the simplicity of the structure of the invention and the efficient transfer of charge from the column conductors to a video output point.

It should also be appreciated that in the FIGURES the substrate is shown as P-type for purpose of illustration only. The substrate as well as the various diffusions and barriers could instead be replaced by regions of opposite conductivity type to those shown in the FIGURES.

In the illustrated embodiments the photo elements of each column were read out onto one column conductor. However, it should be appreciated that each photo element could be positioned between two conductors with a barrier gate between each conductor and the photo element. Upon read-out the charge on the photo element would flow to and divide between, the two conductors.

What is claimed is:

1. A solid state image sensor comprising:
   a substrate;
   a matrix array of photo sensitive elements, formed along one surface of said substrate, arranged in rows and columns,
   a column conductor per column of photo elements formed in said one surface of said substrate,
   a first conductive layer insulated from and overlying said one surface of said substrate for forming a barrier gate means and a guard band means associated with each photo element;
   said barrier gate means formed between one side of each photo element of a column and its corresponding column conductor for normally preventing the flow of charge between the photo elements and their column conductors;
   said guard band means formed around the remaining sides of each photo element having a higher potential barrier than said barrier gate means for preventing flow of charge from the element across said remaining sides;
   a row conductor per row of photo elements formed of a second conductive layer insulated from and overlying said first conductive layer also overlying its corresponding row of elements; and
   means for applying driving voltages to said row conductors for, during one time interval, placing said photo sensitive elements in a charge integration mode, and for, during another time interval, causing the integrated charge of each element of a row to rise above the potential barrier of said barrier gate and to flow via a conductive path into said column conductors.

2. The combination as claimed in claim 1 wherein the photo sensitive element region has a first doping level and the substrate region around each photo element region has a second, different, doping level for producing said guard band means region having a higher potential barrier than said barrier gate means region.

3. The combination as claimed in claim 1 wherein said photo sensitive elements include a region of opposite conductivity type to said substrate formed in said one surface of said substrate.

4. The combination as claimed in claim 3 wherein said barrier gate means includes a region of said opposite conductivity type extending between said photo elements and their corresponding column conductor and means for applying a bias to said first conductive layer.

* * * * *